(12) United States Patent
Furukawa et al.

(10) Patent No.: US 10,041,980 B2
(45) Date of Patent: Aug. 7, 2018

(54) THREE-DIMENSIONAL SURFACE POTENTIAL DISTRIBUTION MEASUREMENT APPARATUS

(71) Applicants: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

(72) Inventors: Masaaki Furukawa, Tokyo (JP); Kodai Ushiwata, Tokyo (JP); Tetsuo Yoshimitsu, Tokyo (JP); Yuichi Tsuboi, Tokyo (JP); Kunihiko Hidaka, Tokyo (JP); Akiko Kumada, Tokyo (JP); Hisatoshi Ikeda, Tokyo (JP)

(73) Assignees: TOSHIBA MITSUBISHI-ELECTRIC INDUSTRIAL SYSTEMS CORPORATION, Chuo-ku (JP); THE UNIVERSITY OF TOKYO, Bunkyo-ku (JP)

( * ) Notice: Subject to any disclaimer, the term of this patent is extended or adjusted under 35 U.S.C. 154(b) by 70 days.

(21) Appl. No.: 15/314,678

(22) PCT Filed: Jun. 6, 2014

(86) PCT No.: PCT/JP2014/003053
§ 371 (c)(1),
(2) Date: Nov. 29, 2016

(87) PCT Pub. No.: WO2015/186160
PCT Pub. Date: Dec. 10, 2015

(65) Prior Publication Data
US 2017/0160314 A1 Jun. 8, 2017

(51) Int. Cl.
*G01R 31/00* (2006.01)
*G01R 15/18* (2006.01)
(Continued)

(52) U.S. Cl.
CPC ........... *G01R 15/242* (2013.01); *G01R 19/00* (2013.01); *G01R 29/14* (2013.01)

(58) Field of Classification Search
CPC ....... G01R 15/242; G01R 29/14; G01R 19/00
(Continued)

(56) References Cited

U.S. PATENT DOCUMENTS 5,559,442 A * 9/1996 Peier .................... G01R 15/242
324/96

FOREIGN PATENT DOCUMENTS

JP  07-092110 A   4/1995
JP  2000-352579 A  12/2000
(Continued)

OTHER PUBLICATIONS

International Search Report dated Aug. 12, 2014 in PCT/JP2014/003053 filed Jun. 6, 2014.
(Continued)

*Primary Examiner* — Farhana Hoque
(74) *Attorney, Agent, or Firm* — Oblon, McClelland, Maier & Neustadt, L.L.P.

(57) ABSTRACT

A three-dimensional surface potential distribution measurement apparatus includes: a laser light source; a Pockels crystal; a mirror; a light detector; a support structure which supports the aforementioned elements while maintaining a relative positional relationship therebetween; a movement driver which can move the support structure three-dimensionally; a rotary driver which supports the test object and can rotate the test object about an axis extending in a longitudinal direction of the test object; and a drive controller which controls the movement driver and the rotary driver. The drive controller coordinates a driving operation by the movement driver and by the rotary driver while maintaining a gap between the second end face of the Pockels crystal and
(Continued)

a surface of the test object at a predetermined value such that the second end face of the Pockels crystal approaches all the surfaces of the electric field reduction system on the test object.

6 Claims, 8 Drawing Sheets

(51) Int. Cl.
  *G01R 15/24* (2006.01)
  *G01R 19/00* (2006.01)
  *G01R 29/14* (2006.01)
(58) Field of Classification Search
  USPC .................................. 324/97, 127, 754.03
  See application file for complete search history.

(56) References Cited

FOREIGN PATENT DOCUMENTS

| | | |
|---|---|---|
| JP | 2011-022007 A | 2/2011 |
| JP | 2013-113637 A | 6/2013 |

OTHER PUBLICATIONS

Kumada, Akiko et al., "The Direct Potential Distribution Measurement of Propagating Surface Discharge by Using Pockels Effect," The Transactions of the Institute of Electrical Engineers of Japan A, 1998, vol. 118, No. 6, pp. 723-728, (6 pages).
Matsumoto, Hirokazu et al., "Oscillatory Waveform Caused by Piezoelectric Vibration of Pockels Crystal and its Effective Suppression," IEEJ transactions on electrical and electronic engineering, 2011, vol. 6, No. 1, pp. 1-6, (6 pages).

* cited by examiner

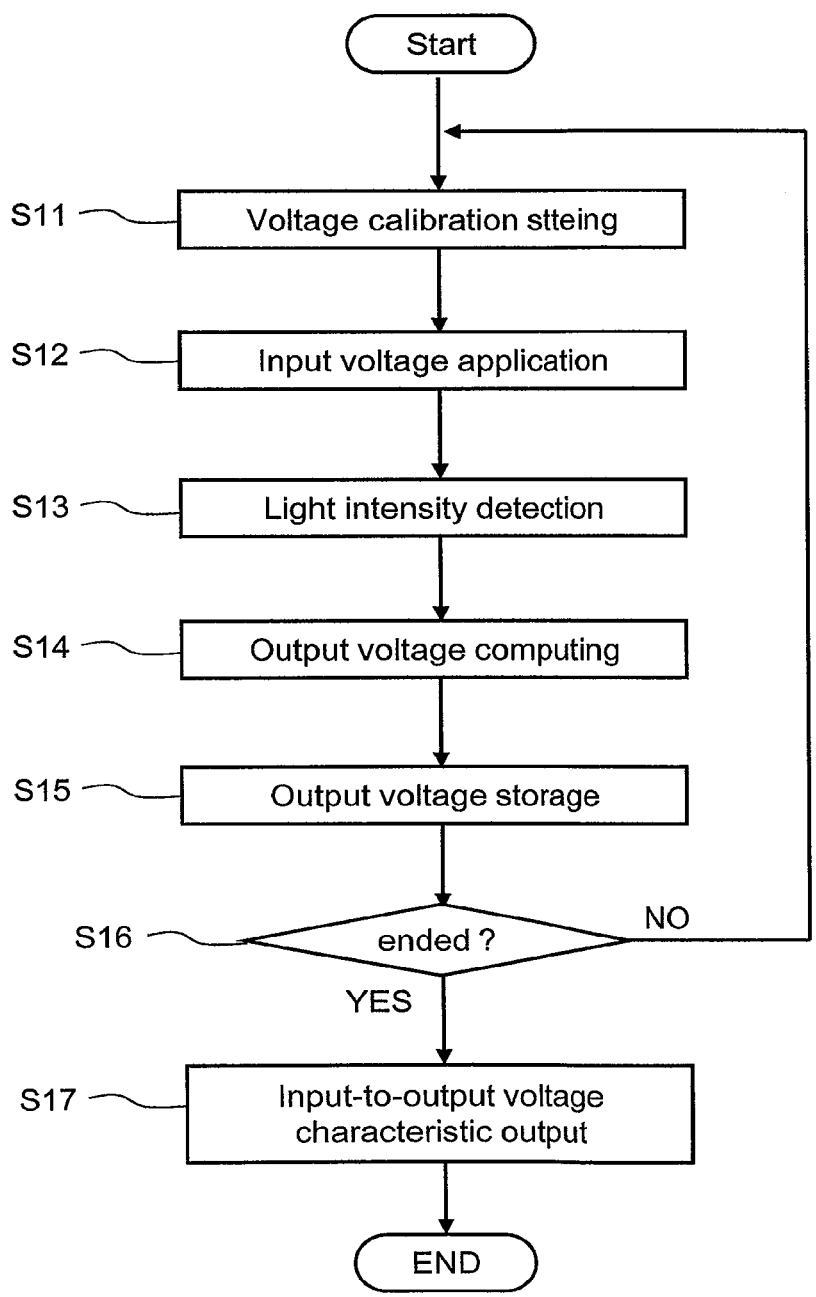

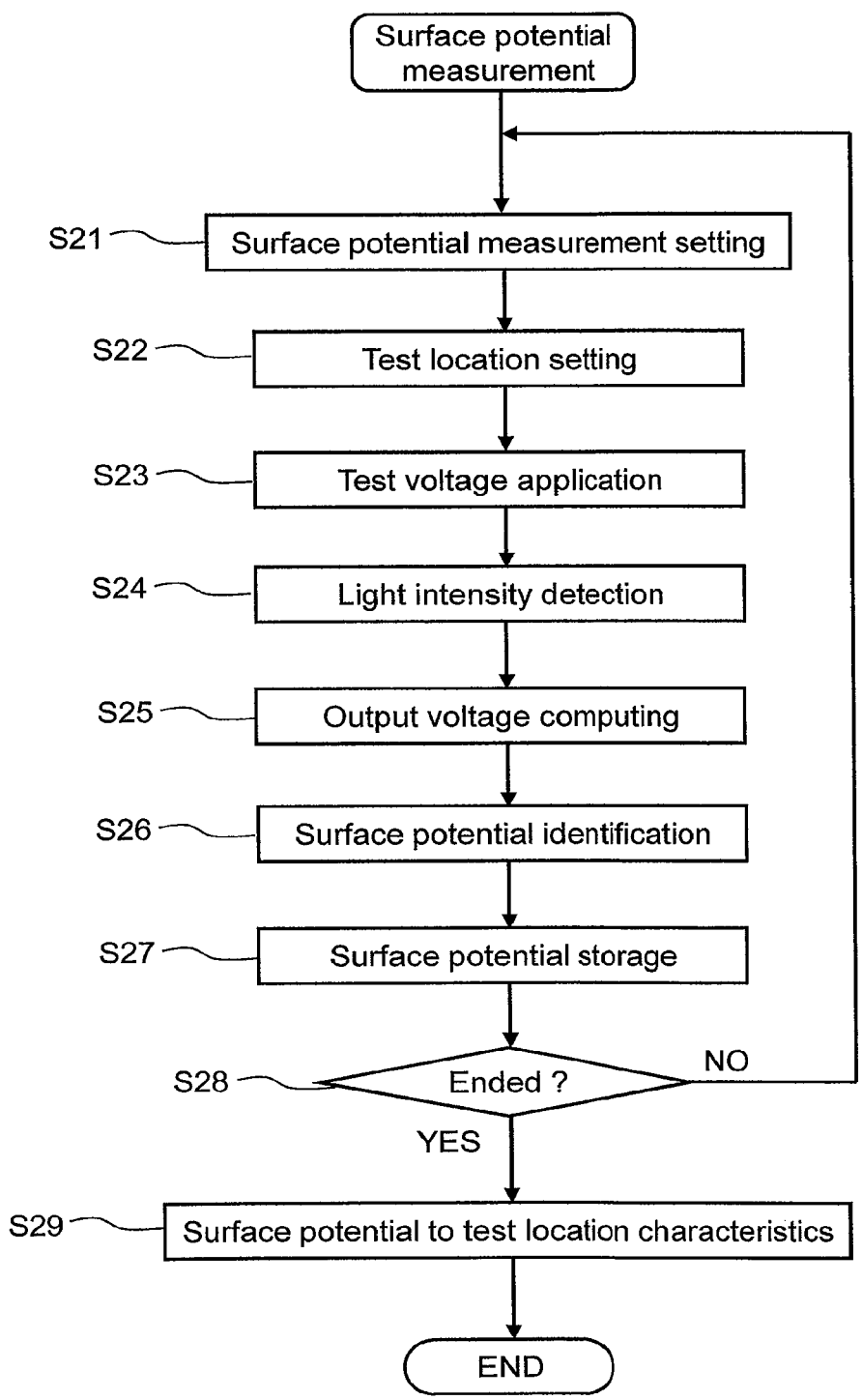

THREE-DIMENSIONAL SURFACE POTENTIAL DISTRIBUTION MEASUREMENT APPARATUS

TECHNICAL FIELD

The present invention relates to a three-dimensional surface potential distribution measurement apparatus.

BACKGROUND ART

Inverter drive systems that drive an electrical rotating machine such as an electrical motor by means of an inverter have been developed and become widespread. In such an inverter drive system, the inverter converts a DC voltage into a pulse voltage by switching operation and supplies the pulse voltage to a rotating electrical machine through cables. The rotating electrical machine is driven by the supplied pulse voltage.

Conventionally, in a high voltage rotating electrical machine, an electric field relaxation system is often provided on a coil surface near a stator core end portion for the purpose of preventing occurrence of partial discharge especially in a portion near the core end portion of the stator coil or heat generation therefrom. The electric field relaxation system is a combination of a low resistance layer derived from a stator core slot and an electric field relaxation layer formed partially on the low resistance layer.

In the inverter drive system, reflected waves are generated due to impedance mismatch between the inverter, the cables, and the rotating electrical machine. When the generated reflected waves are superimposed on the pulse voltage, high voltage noise, so-called inverter surge may occur between the cables and the rotating electrical machine, especially, at connecting portions between the cables and the rotating electrical machine.

When the pulse voltage including the inverter surge (hereinafter, referred to as "inverter pulse voltage") repeatedly occurs, the partial discharge or heat generation, which are not caused during operating time by commercial frequency, is caused at the stator coil of the core end portion (hereinafter, referred to as "stator coil end"). Further, the partial discharge or heat generation that may cause deterioration in reliability-related characteristics occurs on the electric field relaxation system. As a result, reliability of the stator coil may be significantly lowered.

Occurrence of the partial discharge or heat generation depends on the gradient of a surface potential of the potential relaxation system (see Non-patent Document 1). Thus, there has been a strong need for a technology that accurately measures the surface potential of the electric field relaxation system in which the inverter pulse voltage is generated.

PRIOR ART DOCUMENTS

Patent Documents

Patent Document 1: Japanese Patent Application Laid-Open Publication No. 2011-22007

Non-Patent Documents

Non-patent Document 1: Akiko Kumada, Masakuni Chiba, Kunihiko Hidaka, "The Direct Potential Distribution Measurement of Propagating Surface Discharge by Using Pockels Effect", THE TRANSACTIONS ON THE INSTITUTE OF ELECTRICAL ENGINEERS Of JAPAN A, vol. 118, No. 6: pp. 723-728 (1998-6)

Non-patent Document 2: Hirokazu Matsumoto, Shigeyasu Matsuoka, Akiko Kumada, Kunihiko Hidaka, "Oscillatory Waveform Caused by Piezoelectric Vibration of Pockels Crystal and its Effective Suppression", IEEJ TRANSACTIONS ON ELECTRICAL AND ELECTRONIC ENGINEERING, 6: 1-6 (2011)

SUMMARY OF THE INVENTION

Problems to be Solved by the Invention

Typically, a surface potential meter is used in measurement of the surface electric potential. In a technology described in Patent Document 1, a probe is brought into contact with or close to the electric field relaxation system, and the surface potential is measured by the surface electrometer. The surface potential is used to compute a nonlinear resistance.

However, the inverter pulse voltage has a high-frequency component of kHz order or more. In this case, the surface electrometer cannot follow the high-frequency component and thus cannot measure the surface potential of the electric field relaxation system in which the inverter pulse voltage is generated.

Typically, for the probe, a metal material is used. Thus, in the above method in which the probe is brought into contact with or close to the electric field relaxation system, a potential variation occurs between the electric field relaxation system and the probe, which may prevent accurate measurement. In addition, when the inverter surge occurs, corona discharge may occur between the electric field relaxation system and the probe. As described above, in a case where a metal material is used as a measurement point, the surface potential of the electric field relaxation system in which the inverter pulse voltage is generated cannot be measured due to disturbance to an object to be measured.

Further, a potential distribution significantly varies especially at a coil corner, so that accurate measurement of the potential distribution is highly required not only for a coil plain portion, but also for the coil corner.

The object of the present invention is to measure a three-dimensional surface potential distribution of the electric field relaxation system in which the inverter pulse voltage is generated.

Means for Solving the Problem

According to the present invention, there is provided a three-dimensional surface potential distribution measurement apparatus to measure a surface potential of an electric field relaxation system which is formed along a longitudinal direction of a test object simulating a stator coil end of a rotating electrical machine, the apparatus comprising: a laser light source configured to emit laser light; a Pockels crystal configured to receive, at its first end face, the laser light emitted from the laser light source; a mirror having a mirror surface positioned at a second end face of the Pockels crystal that is opposed to the first end face, the mirror being configured to reflect the laser light from the one end face of the Pockels crystal in a direction opposite to the incident direction of the laser light; a light detector having a band following a high-frequency component of an inverter pulse voltage, the light detector being configured to receive the laser light reflected by the mirror, and to detect a light intensity of the laser light corresponding to an output voltage which is a potential difference between the first end face of the Pockels crystal and the second end face thereof; a support structure configured to support the laser light source, the Pockels crystal, the mirror, and the light detector while maintaining a relative positional relationship thereamong; a movement driver capable of three-dimensionally moving the support structure; a rotary driver configured to support the test object, the rotary driver being capable of rotating the test object about an axis extending in a longitudinal direction of the test object in both clockwise and counterclockwise directions; and a drive controller configured to control the movement driver and the rotary driver, wherein the drive controller coordinates a driving operation by the movement driver and a driving operation by the rotary driver while maintaining a gap between the second end face of the Pockels crystal and a surface of the test object at a predetermined value such that the second end face of the Pockels crystal approaches the surfaces of the electric field relaxation system on the test object.

Advantage of the Invention

According to the present invention, it is possible to measure a three-dimensional surface potential distribution of the electric field relaxation system in which the inverter pulse voltage is generated.

BRIEF DESCRIPTION OF THE DRAWINGS

FIG. 3 is a flowchart illustrating the voltage calibration processing performed by the 3D surface potential distribution measurement apparatus according to the present embodiment.

FIG. 4 is a flowchart illustrating a procedure of the surface potential measurement performed by the 3D surface potential distribution measurement apparatus according to the first embodiment.

FIG. 5A illustrates a measurement start state of a first surface of the electric field relaxation system. FIG. 5B illustrates a measurement end state of the first surface of the electric field relaxation system. FIG. 5C illustrates a measurement state of a corner portion of the electric field relaxation system. FIG. 5D illustrates a measurement state of a second surface adjacent to the first surface.

EMBODIMENTS FOR CARRYING OUT THE INVENTION

Figure 1:
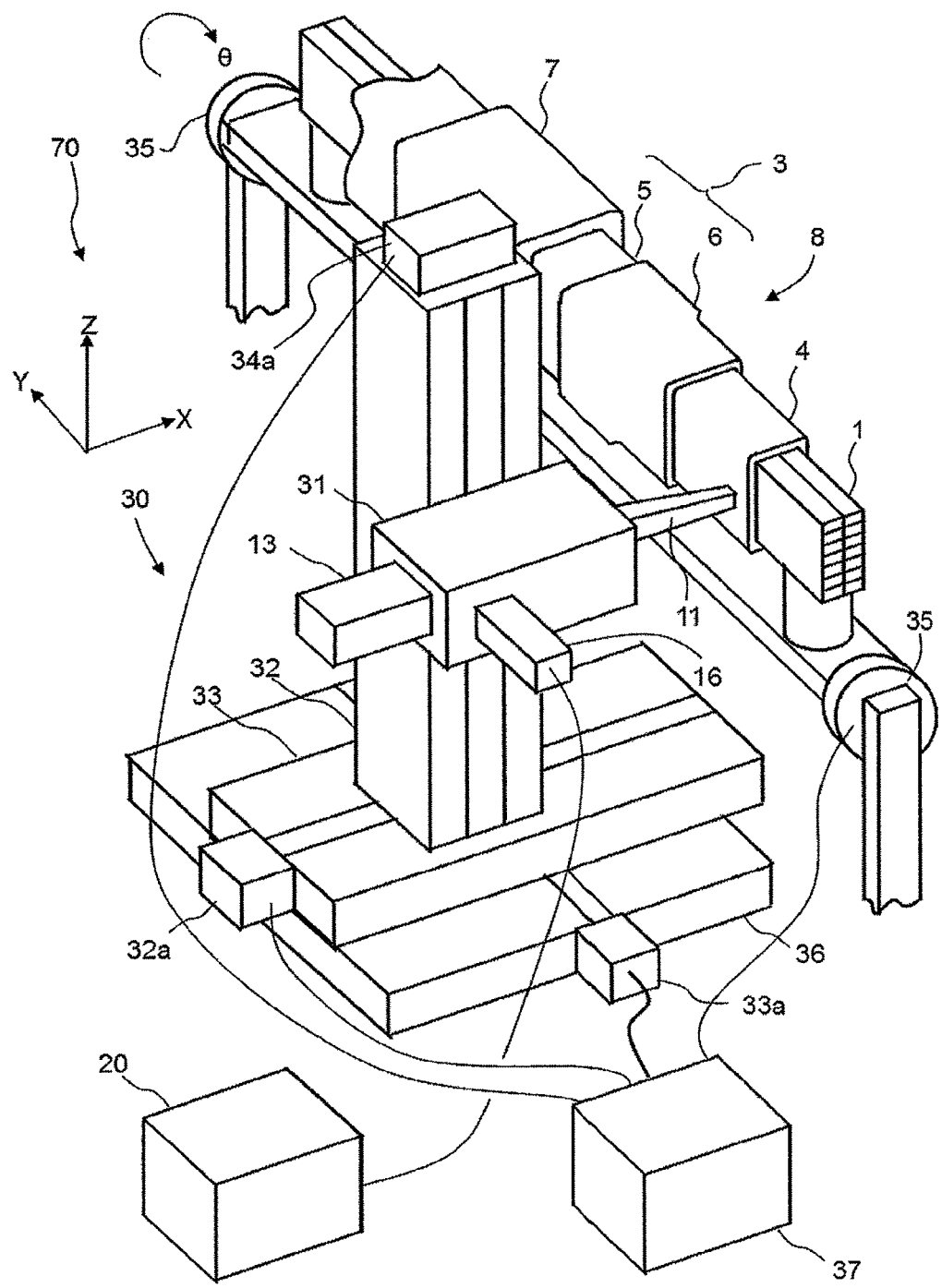
FIG. 1 is a perspective view illustrating a configuration of a 3D surface potential distribution measurement apparatus according to a first embodiment.

Embodiments of a three-dimensional surface potential distribution measurement apparatus according to the present invention will be described with reference to the drawings. Throughout the description, the same reference numerals are given to the same or similar parts, and repeated description will be omitted.

First Embodiment

FIG. 1 is a perspective view illustrating a configuration of a three-dimensional ("3D") surface potential distribution measurement apparatus according to a first embodiment. A test object which is an object to be measured by a 3D surface potential distribution measurement apparatus ("device") 70 according to the present embodiment is a stator coil end simulation test body 8 for simulating an electric field relaxation system 3 formed at an end portion of a stator (not illustrated) constituting a rotating electrical machine together with a rotor (not illustrated). The electric field relaxation system 3 is a system for preventing corona discharge.

The 3D surface potential distribution measurement apparatus 70 that measures a surface potential distribution of the stator coil end simulation test body 8 as a test object includes a measuring device body 10 (see FIG. 2), a computing device 20, and a support/mount unit 30. In the measuring device body 10, a semiconductor laser generator (hereinafter, referred to as "laser light source") 13 irradiates a Pockels crystal 11 supported by a support structure 31 with laser light, a light detector 16 extracts reflected light depending on the surface potential of the stator coil end simulation test body 8 which is the object to be measured, and the computing device 20 computes the potential of the object to be measured. Details of the measuring device body 10 will be described later using FIG. 2.

As a mechanism for adjusting a relative position between the Pockels crystal 11 supported by the support structure 31 and the stator coil end simulation test body 8 which is the object to be measured, there are provided a support/mount unit 30 that makes the support structure 31 access the surface of the object to be measured and a rotary driver 35 that rotates the stator coil end simulation test body 8 about a longitudinal direction axis thereof.

The support/mount unit 30 includes the support structure 31, an X-direction moving section 32, an X-direction driver 32a for driving the X-direction moving section 32, a Y-direction moving section 33, a Y-direction driver 33a for driving the Y-direction moving section 33, a Z-direction driver 34a for driving the support structure 31, the rotary driver 35, a base 36, and a drive controller 37. The drive controller 37 controls the X-direction driver 32a, Y-direction driver 33a, and Z-direction driver 34a. The X-direction is a horizontally longitudinal direction of the Pockels crystal 11 (FIG. 2), and Y-direction is a horizontally longitudinal direction of a stator coil conductor 1, that is, perpendicular to the X-direction. The Z-direction is an upward direction in FIG. 1, that is, a vertical direction.

The support structure 31 that supports the Pockels crystal 11 is driven by the Z-direction driver 34a while being supported by the X-direction moving section 32 to vertically move in the Z-direction (vertical up-down direction). The X-direction moving section 32 is driven by the X-direction driver 32a while being supported by the Y-direction moving section 33 to move back and forth on the Y-direction moving section 33 in the X-direction. The Y-direction moving section 33 moves back and forth on the base 36 in the Y-direction while being supported by the base 36.

The X-direction driver 32a, Y-direction driver 33a, and Z-direction driver 34a are collectively referred to as "movement driver". The movement driver causes the Pockels crystal 11 to three-dimensionally move. Elements of the movement driver, that is, the X-direction driver 32a, Y-direction driver 33a, and Z-direction driver 34a each perform driving in response to an instruction from the drive controller 37. Further, the X-direction driver 32a, Y-direction driver 33a, and Z-direction driver 34a each output information concerning a travel direction and a travel distance to the drive controller 37.

The stator coil end simulation test body 8 is rotatably supported by the rotary driver 35. The rotary driver 35 drives/rotates the test body in response to demand from the drive controller 37. The rotary driver 35 outputs information concerning a rotation direction and a rotation angle to the drive controller 37.

The following describes the electric field relaxation system 3 provided in the stator coil end simulation test body 8. A ground insulating tapes mainly formed of mica-epoxy are wound around the outer periphery of the stator coil conductor 1 as a main insulating layer 4. The insulating tapes are provided for making insulating coating for the stator coil conductor 1. Further, high resistance semiconductive tapes are wound around the main insulating layer 4 of the stator coil end simulation test body 8 as an electric field relaxation layer 6 so as to cover an end portion of a low resistance layer 5. The high resistance semiconductive tapes are provided for reducing potential gradient.

On the low resistance layer 5, low resistance semiconductive tapes are wound around the outer periphery of the main insulating layer 4 from a portion where the main insulating layer 4 faces the inner periphery of a stator core 7 to a portion where the main insulating layer 4 is exposed outside the stator core 7. The width of the low resistance layer 5 provided outside the stator core 7 is about several tens of mm.

The low resistance layer 5 is grounded together with the stator core 7. Therefore, the stator coil conductor 1 serves as a drive electrode, and the low resistance layer 5 serves as a ground electrode when a voltage (AC voltage) is applied to the stator coil conductor 1. In this case, equipotential lines generated between the stator coil conductor 1 and the low resistance layer 5 in the stator core 7 run nearly parallel to each other.

The equipotential lines generated between the stator coil conductor 1 and the low resistance layer 5 in the stator coil end simulation test body 8 are distributed in the thickness direction of the main insulating layer 4. In the stator coil end simulation test body 8, the equipotential lines are densely distributed depending on a difference in relative permittivity between the main insulating layer 4 and the stator coil conductor 1 or resistivity of a surface of the stator coil conductor 1.

Therefore, the potential gradient becomes large on a surface of the stator coil end simulation test body 8, and an electric field is concentrated in a surface direction of the stator coil end simulation test body 8. Particularly, at the end portion of the low resistance layer 5, the potential gradient becomes significantly large, and thus partial discharge or surface discharge which is corona discharge is likely to occur.

Thus, in order to prevent occurrence of the partial discharge or surface discharge, the electric field relaxation layer 6 is formed around the outer periphery of the end portion of the low resistance layer 5, and outer periphery of the main insulating layer 4 of the stator coil end simulation test body 8.

A cross-section of the stator coil conductor 1 has a rectangular shape, and that of the electric field relaxation layer 6 has a rounded shape following the rectangular shape of the stator coil conductor 1 inside thereof. That is, the electric field relaxation layer 6 has substantially flat side portions and rounded corners between the side portions. A surface electric field distribution at the substantially flat side portion is different in pattern from that at the rounded corner. Attention needs to be paid to the electric field distribution particularly at the corner portion.

The stator coil end simulation test body 8 described above simulates the electric field relaxation system including the electric field relaxation layer 6 formed around the stator coil end of a real machine.

Figure 2:
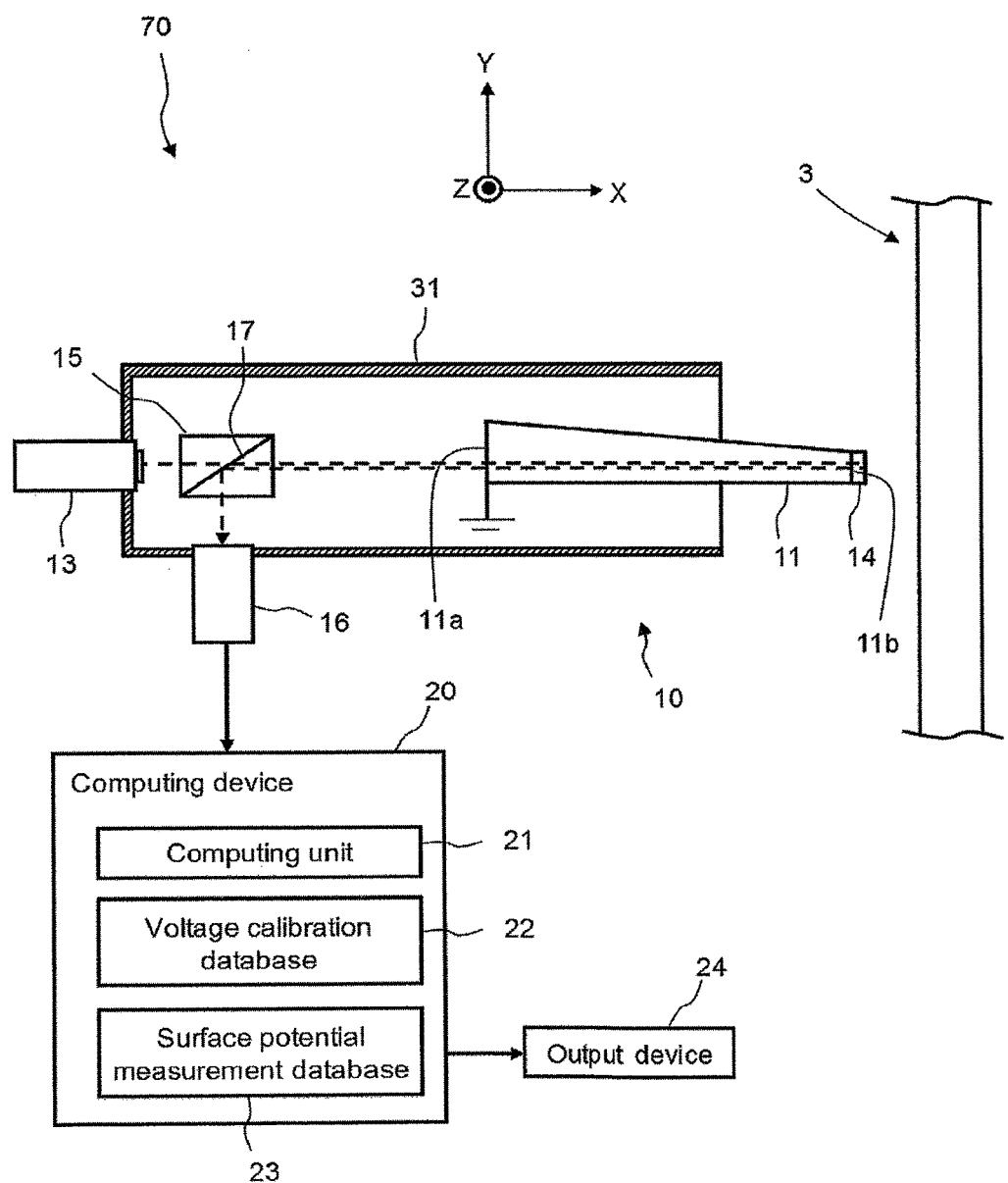
FIG. 2 is a longitudinal cross-sectional, plan view of a body including a Pockels crystal of the 3D surface potential distribution measurement apparatus according to the first embodiment.

FIG. 2 is a longitudinal cross-sectional plan view of a body including the Pockels crystal of the 3D surface potential distribution measurement apparatus according to the first embodiment. The measuring device body 10 includes the laser light source 13, a polarization beam splitter (hereinafter, referred to as "PBS") 15, a wave length plate 17, the Pockels crystal 11, a dielectric mirror (hereinafter referred to as "mirror") 14, the light detector 16, and the support structure 31 supporting those elements.

The laser light source 13 emits laser light in an incident direction (X-direction) perpendicular to the longitudinal direction (Y-direction) of the electric field relaxation system 3. The laser light has a wavelength of 532.0 nm, a maximum output of 10 mW, and a diameter of 0.34 mm. However, the wavelength is not limited to 532.0 nm, but the laser light may have different wavelengths as long as it can propagate through the Pockels crystal 11 and optical components without being significantly attenuated.

The laser light is linearly polarized light, and polarization plane thereof is parallel to a direction (Z-direction) perpendicular to both the incident direction (X-direction) and longitudinal direction (Y-direction) of the electric field relaxation system 3.

The PBS 15 transmits therethrough only the linearly polarized light. The PBS 15 transmits therethrough the laser light emitted from the laser light source 13 in the incident direction (X-direction).

The Pockels crystal 11 is disposed such that an axial direction thereof is parallel to the incident direction (X-direction). The Pockels crystal 11, laser light source 13, and PBS 15 are arranged in the incident direction (X-direction).

The Pockels crystal 11 extends between first end face 11a and second end face 11b thereof from the first end face 11a toward the second end face 11b in the axial direction (X-direction). The Pockels crystal 11 is formed in such a way that the size of a cross section perpendicular to the axial direction changes along the axial direction. As described later, the wave length plate serves as an element concerning a phase of the cosine function representing a detected light intensity Pout.

In the present embodiment, a cross-sectional shape of the Pockels crystal 11 perpendicular to the axial direction thereof is a square shape. That is, the length of a side of the square is linearly reduced in the X-direction.

Of the four side surfaces of the Pockels crystal 11 extending in the axial direction, one pair of adjacent sides are parallel to the axial direction, and the other pair of adjacent sides are inclined with respect to the axial direction. However, the present invention is not limited to this, and a following configuration is possible, in which at least one side surface is inclined with respect to the axial direction, and the remaining side surfaces are parallel to the axial direction. Even in this configuration, the cross-sectional area of the Pockels crystal 11 changes in the axial direction.

The first end face 11a of the Pockels crystal 11 may be grounded. Alternatively, the first end face 11a of the Pockels crystal 11 may be set to 0 [V] by a power supply unit.

The laser light from the PBS 15 enters the first end face 11a of the Pockels crystal 11 and travels toward the second end face 11b thereof that does not intersect the first end face 11a.

A surface of the mirror 14 is mounted on the second end face 11b of the Pockels crystal 11. The second end face 11b of the Pockels crystal 11 which is a rear surface of the mirror 14 is in a state of being applied with a voltage due to influence of an electromagnetic field around the electric field relaxation system 3.

The rear surface of the mirror 14 is spaced apart from the test location, i.e., a test target part of the electric field relaxation system 3 by a predetermined distance. The predetermined distance is set in consideration of a degree of irregularity of a resin layer surface of the electric field relaxation system 3, spatial resolution, and the like. Details will be described later using FIGS. 5A to 5D.

The mirror 14 reflects the laser light entering the first end surface 11a of the Pockels crystal 11 in an opposite direction (minus X-direction) to the incident direction (X-direction).

The Pockels crystal 11 is a piezoelectric isotropic crystal belonging to "crystal point group 43m or 23" and generates a Pockets effect. Herein, the "4" of "43m" has overbar not illustrated. The Pockels effect is a phenomenon where birefringence is observed when an isotropic crystal of a dielectric body is placed in an electric field or a voltage is applied.

That is, a refractive index changes depending on the applied voltage. As a result, light intensity changes. As the Pockels crystal 11, a BGO (e.g. $Bi_{12}GeO_{20}$) crystal can be exemplified.

The Pockels crystal can be made to have sensitivity to a component parallel or perpendicular to a propagation direction of light in an external electric field depending on angle between the crystal orientation and the propagation direction of the incident light. The former is referred to as "longitudinal modulation" and the latter as "transversal modulation".

The Pockels crystal belonging to "crystal point group 43m or 23" is a crystal that can make the longitudinal modulation arrangement. In this longitudinal modulation arrangement, light intensity changes in proportion to an integrated value of a component of the external electric field parallel to an optical path, i.e., voltage.

The light intensity of the laser light reflected by the mirror 14 corresponds to an output voltage VPout which is a potential difference between the first end face 11a and the second end face 11b of the Pockels crystal 11.

The PBS 15 transmits therethrough the laser light reflected by the mirror 14 in the longitudinal direction Y (in the present embodiment, minus Y-direction).

The light detector 16 has a frequency band following a high-frequency component of an inverter pulse voltage. The light detector 16 is disposed in the longitudinal direction Y (in the present embodiment, minus direction Y) with respect to the PBS 15. The light detector 16 receives the laser light from the PBS 15 and detects a detection light intensity Pout as a light intensity of the laser light.

The detection light intensity Pout corresponds to the output voltage VPout which is a potential difference between the first end face 11a and the second end face 11b of the Pockels crystal 11. The detection light intensity Pout is represented by the following expression with a cosine function of the output voltage VPout.

$$Pout = (Pin/2) \times \{1 - \cos(\pi(VPout/V\pi) - \theta 0)\}$$

In the above expression, Pin is an incident light intensity of the Pockels crystal 11, $V\pi$ is a half wavelength voltage, and $\theta 0$ is a phase difference (arbitrary value) to be provided by the wave length plate 17. When the wave length plate 17 is not used, the measured voltage range Vp is about 16 V with a laser wavelength of 532 nm and 35 kV with a laser wavelength of 1.3 μm. Therefore, when the laser wavelength is 1.3 mm, use of the wavelength plate makes voltage measurement equivalent to the case where the laser wavelength is 532 nm.

The output voltage VPout of the Pockels crystal 11 is computed according to an inverse function of the above cosine function based on the detection light intensity Pout.

As the Pockels crystal 11, a comparatively long crystal of 100 mm length is used, so that disturbance of the electric field distribution on a surface of the dielectric body due to approach of the Pockels crystal 11 is small. Therefore, the output voltage VPout of the Pockels crystal 11 is proportional to the surface potential of the electric field relaxation system 3 to be measured.

The computing device 20 is a computer connected to the light detector 16 and an output device 24. The computing device 20 includes a CPU (Central Processing Unit) and a storage unit.

The storage unit stores a computer program. The CPU reads out and executes computer programs. As the output device 24, a display or a printer can be exemplified.

The computing device 20 includes, as functional blocks of the CPU, a computing unit 21, a voltage calibration database 22, and a surface potential measurement database 23. The computing device 20 is connected to the output device 24 and outputs computing results to the output device 24.

The following describes operation of the 3D surface potential distribution measurement apparatus 70 according to the first embodiment.

The 3D surface potential distribution measurement apparatus 70 performs voltage calibration processing to be described later before the test and then performs surface potential measurement processing to be described later during the test. The computing unit 21 constructs the voltage calibration database 22 through the voltage calibration processing and refers to the voltage calibration database 22 during the surface potential measurement processing. To the computing unit 21, the voltage calibration processing or surface potential measurement processing is set by, e.g., operator's input operation.

FIG. 3 is a flowchart illustrating the voltage calibration processing performed by the 3D surface potential distribution measurement apparatus 70 according to the first embodiment.

First, a voltage calibration processing mode is set to the computing unit 21 (step S11: voltage calibration setting). Then, an AC voltage of, e.g., 50 Hz is applied, as an input voltage Vin [kV] to the rear surface of the mirror 14 provided at the end portion of the Pockels crystal 11 of the 3D surface potential distribution measurement apparatus 70 (step S12: input voltage application).

In this state, the laser light emitted from the laser light source 13 reaches the mirror 14 through the PBS 15 and Pockels crystal 11 and is reflected thereby, and the laser light reflected by the mirror 14 enters the light detector 16 through the Pockels crystal 11 and PBS 15. The light detector 16 detects the light intensity of the laser light from the PBS 15 as the detection light intensity Pout (step S13: light intensity detection).

In the voltage calibration mode, the computing unit 21 performs the following processing. First, the computing unit 21 uses the above cosine function to compute the output voltage VPout [V] of the Pockels crystal 11 from the detection light intensity Pout. That is, the output voltage VPout [V] corresponding to the detection light intensity Pout is derived based on the detection light intensity Pout (step S14: output voltage computing).

The computing unit 21 stores the output voltage VPout [V] in the voltage calibration database 22 together with the above input voltage Vin [kV] input through the input operation by the operator (step S15: output voltage storage).

Thereafter, when the voltage calibration processing is not ended (NO in step S16), the computing unit 21 repeats the processing of steps S11 to S15 while changing the input voltage Vin [kV]. As a result, input-to-output voltage characteristics representing a relationship between the different input voltages Vin [kV] and their corresponding output voltages VPout [V] of the Pockels crystal 11 are stored in the voltage calibration database 22. Such input-to-output voltage characteristics are generated to construct the voltage calibration database 22.

When the voltage calibration processing is ended (YES in step S16), the computing unit 21 outputs the input-to-output voltage characteristics stored in the voltage calibration database 22 to the output device 24. When the output device 24 is a display device, the input-to-output voltage characteristics are displayed on the display device; when the output device 24 is a printer, the input-to-output voltage characteristics are printed by the printer (step S17: input-to-output voltage characteristics output).

FIG. 4 is a flowchart illustrating a procedure of the surface potential measurement performed by the 3D surface potential distribution measurement apparatus according to the first embodiment. First, a surface potential measurement mode is set to the computing unit 21 (step S21: surface potential measurement setting).

Then, the Pockels crystal 11 of the 3D surface potential distribution measurement apparatus 70 is moved by the drive controller 37 so as to sequentially measure the surface of the electric field relaxation system 3 at both ends of the stator coil end simulation test body 8 (step S22: test location setting). Details will be described using FIGS. 5A to 5D.

Then, an AC voltage of, e.g., 50 Hz having a peak value of 10 kV is applied, as a test voltage, to the stator coil of the rotating electrical machine (step S23: test voltage application). In this state, the laser light emitted from the laser light source 13 reaches the mirror 14 through the PBS 15 and Pockels crystal 11 and is reflected thereby, and the laser light reflected by the mirror 14 enters the light detector 16 through the Pockels crystal 11 and PBS 15. The light detector 16 detects the light intensity of the laser light from the PBS 15 as the detection light intensity Pout (step S24: light intensity detection).

In the surface potential measurement mode, the computing unit 21 performs the following processing. First, the computing unit 21 uses the above described cosine function to compute the output voltage VPout [V] of the Pockels crystal 11 from the detection light intensity Pout. That is, the output voltage VPout [V] corresponding to the detection light intensity Pout is derived based on the detection light intensity Pout. Here, the output voltage VPout [V] is set as an output voltage Vout [V] at test time (step S25: output voltage computing).

The computing unit 21 refers to the input-to-output voltage characteristics stored in the voltage calibration database 22 to identify the input voltage Vin [kV] corresponding to the output voltage Vout [V] at test time as a surface potential Vsuf [kV] of the electric field relaxation system 3 (step S26: surface potential identification).

The computing unit 21 stores the surface potential Vsuf [kV] in the surface potential measurement database 23 together with the above test location L [mm] input through the input operation by the operator (step S27: surface potential storage).

Thereafter, when the surface potential measurement processing is not ended (NO in step S28), the computing unit 21 repeats the processing of steps S21 to S27 while changing the test location L [mm]. When the surface potential measurement processing is ended (YES in step S28), the computing unit 21 stops repeating the processing of steps S21 to S27 and outputs the surface potential-to-test location characteristics (step S29).

In this manner, when the test location L is set at different positions with respect to the rear surface of the mirror 14, the computing unit 21 stores the different test locations and their corresponding surface potentials Vsuf [kV] of the electric field relaxation system 3 in the surface potential measurement database 23.

As a result, the surface potential-to-test location characteristics representing a relationship between the different test locations and their corresponding surface potentials Vsuf [kV] of the electric field relaxation system 3 are stored in the surface potential measurement database 23.

Figure 5A:
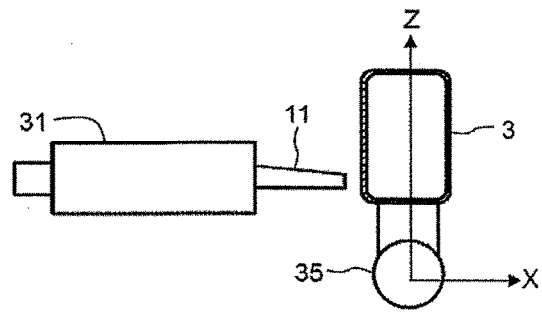
FIGS. 5A to 5D are elevational cross-sectional views illustrating the driving process performed in the 3D surface potential distribution measurement apparatus according to the first embodiment.
Figure 5B:
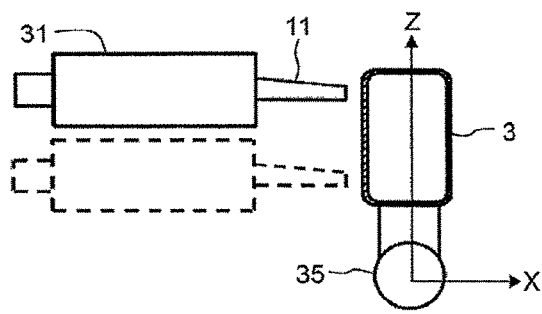
Figure 5C:
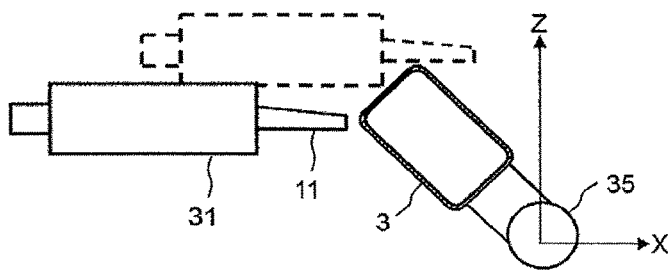
Figure 5D:
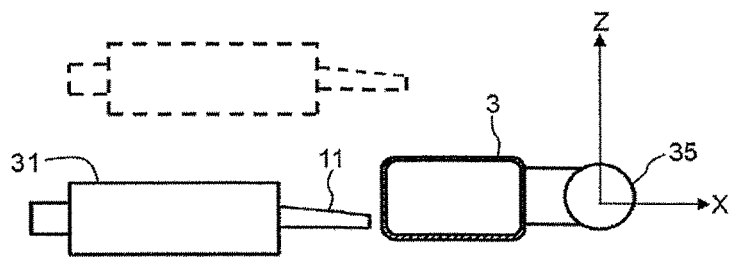

FIGS. 5A to 5D are elevational cross-sectional views illustrating the driving process performed in the 3D surface potential distribution measurement apparatus according to the first embodiment. FIG. 5A illustrates a measurement start state of a first surface of the electric field relaxation system, FIG. 5B illustrates a measurement end state of the first surface of the electric field relaxation system, FIG. 5C illustrates a measurement state of a corner portion of the electric field relaxation system, and FIG. 5D illustrates a measurement state of a second surface adjacent to the first surface. In FIGS. 5B, 5C, and 5D, the Pockels crystal 11 and support structure 31 depicted in dashed lines are those at a position before movement.

Basically, the drive controller 37 computes a required moving distance of the support structure 31 in X-direction, Y-direction, and Z-direction and a required rotation angle of the electric field relaxation system 3 of the stator coil end simulation test body 8, outputs an instruction indicating a required drive amount corresponding to the required moving distance to the X-direction driver 32a, Y-direction driver 33a, and Z-direction driver 34a, outputs an instruction indicating a drive amount corresponding to the required rotation angle to the rotary driver 35 to thereby moves the Pockels crystal 11 to a target position and rotates the stator coil end simulation test body 8 to a target angle position.

At this time, the drive controller 37 computes the above positions such that a distance between a leading end of the Pockels crystal 11 and the surface of the electric field relaxation system 3 is maintained at a predetermined value. The drive controller 37 computes the moving direction and distance or rotation direction and angle such that parts of the Pockels crystal 11 other than the leading end of the Pockels crystal 11 do not interfere with the electric field relaxation system 3. Thus, the drive controller 37 performs control while coordinating a driving operation of the support structure 31 and a driving operation of the stator coil end simulation test body 8 by the rotary driver 35.

At the measurement start state of the first surface of the electric field relaxation system 3 illustrated in FIG. 5A, the electric field relaxation system 3 which is an object to be measured is fixed, while the support structure 31 supporting the Pockels crystal 11 is moved toward the first surface of the electric field relaxation system 3.

During a time period between the measurement start state of the first surface illustrated in FIG. 5A and the measurement end state of the first surface illustrated in FIG. 5B, the electric field relaxation system 3 which is an object to be measured is fixed, while the support structure 31 supporting the Pockels crystal 11 is moved in the Y- and Z-directions along the side surface of the electric field relaxation system 3.

During a time period between the measurement end state of the first surface illustrated in FIG. 5B and the measurement state of the corner portion illustrated in FIG. 5C, the electric field relaxation system 3 which is an object to be measured is rotated. If the support structure 31 stays at the same position, it will interfere with the electric field relaxation system 3. To prevent this, the support structure 31 is moved in the X-direction (minus X-direction). After that, the support structure 31 is moved in the Z-direction (minus Z-direction) to a position corresponding to the next corner portion of the electric field relaxation system 3.

During a time period between the measurement end state of the corner portion illustrated in FIG. 5C and the measurement state of the second surface, illustrated in FIG. 5D, adjacent to the first surface, the electric field relaxation system 3 as an object to be measured is rotated. At this time, the support structure 31 is moved in the X-direction (minus X-direction) so as to avoid interference with the electric field relaxation system 3. After that, the support structure 31 is moved in the Z-direction (minus Z-direction) to a position corresponding to the second surface of the electric field relaxation system 3.

By repeating the above operations, it is possible to measure the electric field distribution over the entire periphery of the electric field relaxation system 3.

As described above, according to the present embodiment, by using the Pockels crystal 11, it is possible to measure the surface potential of the electric field relaxation system 3 in which the inverter pulse voltage is generated while ensuing high responsiveness. Further, the potential distribution at the corner portion of the electric field relaxation system 3 can be measured without any large-scale devices.

Second Embodiment

Figure 6:
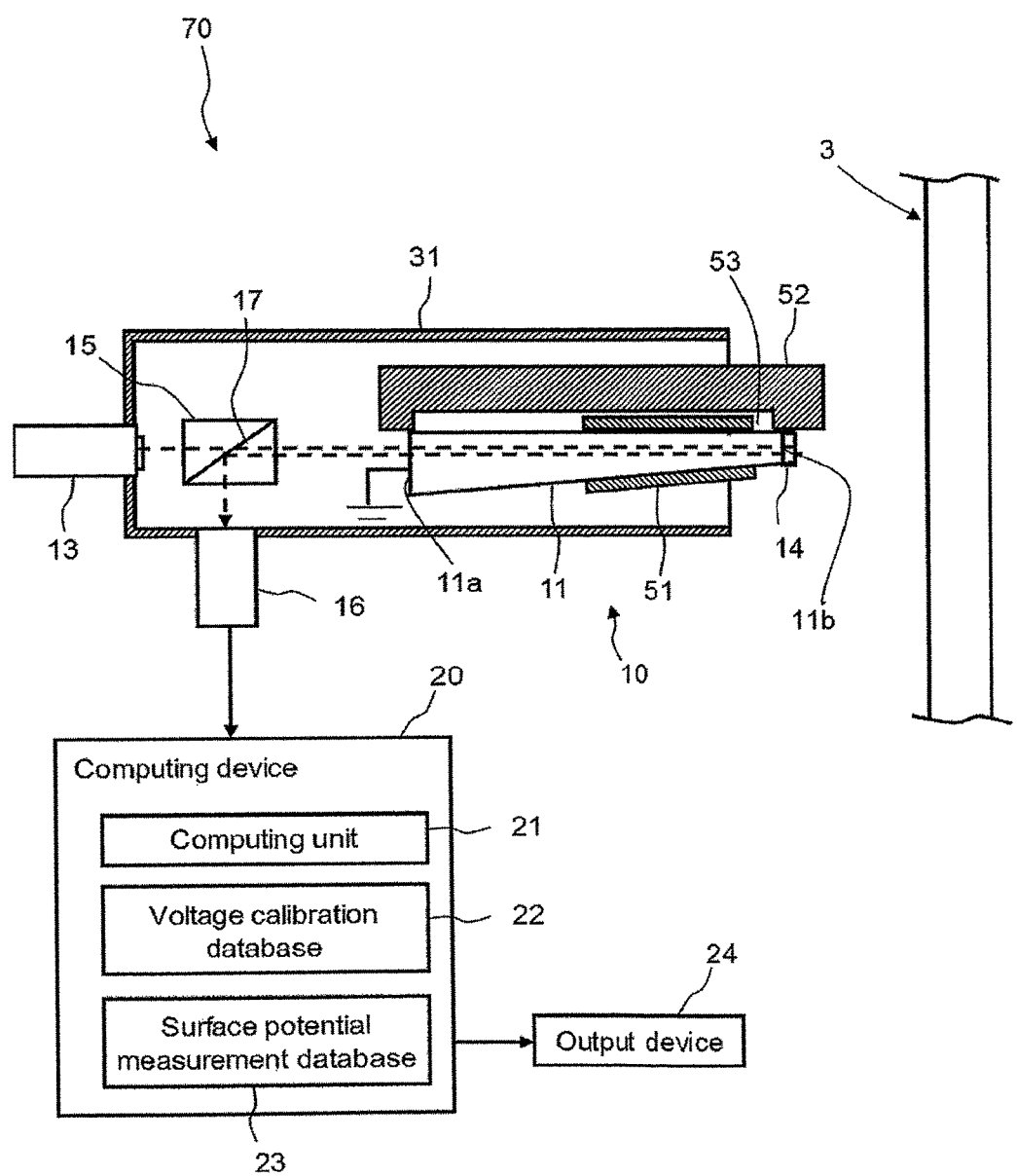
FIG. 6 is a longitudinal direction cross-sectional plan view of a body including the Pockels crystal of a 3D surface potential distribution measurement apparatus according to a second embodiment.

FIG. 6 is a longitudinal cross-sectional plan view of a body including the Pockels crystal of a 3D surface potential distribution measurement apparatus according to a second embodiment. The second embodiment is a modification of the first embodiment.

In the present embodiment, a Pockels crystal holder 51 holds the side surface of the Pockels crystal 11. The Pockels crystal holder 51 holds the Pockels crystal 11 with a force not so strong as to cause significant distortion in the Pockels crystal 11.

The Pockels crystal holder 51 is driven axially while holding the Pockels crystal 11. The Pockels crystal holder 51 has a part partially fitted to a movement limiter 53 which is a concave portion formed in a protecting part 52.

The fitting structure between the movement limiter 53 and the Pockels crystal holder 51 is formed such that the second end face 11b of the Pockels crystal 11 and the mirror 14 do not protrude from an end portion of the protecting part 52 on the electric field relaxation system 3 side even when the Pockels crystal holder 51 is driven toward the axial direction so as to make a closest approach to the electric field relaxation system 3.

According to the present embodiment as described above, even if a target position of the Pockels crystal 11 is set so as to cause interference between the Pockels crystal 11 and the electric field relaxation system 3 in the measurement along the longitudinal direction of the electric field relaxation system 3, the Pockels crystal 11 does not protrude from the protecting part 52, thus preventing the Pockels crystal 11 from being damaged due to contact with the electric field relaxation system 3.

As described above, according to the present embodiment, it is possible to measure with accuracy the surface potential of the electric field relaxation system 3 in which the inverter pulse voltage is generated without damaging the soundness of the tapered Pockels crystal 11.

Third Embodiment

Figure 7:
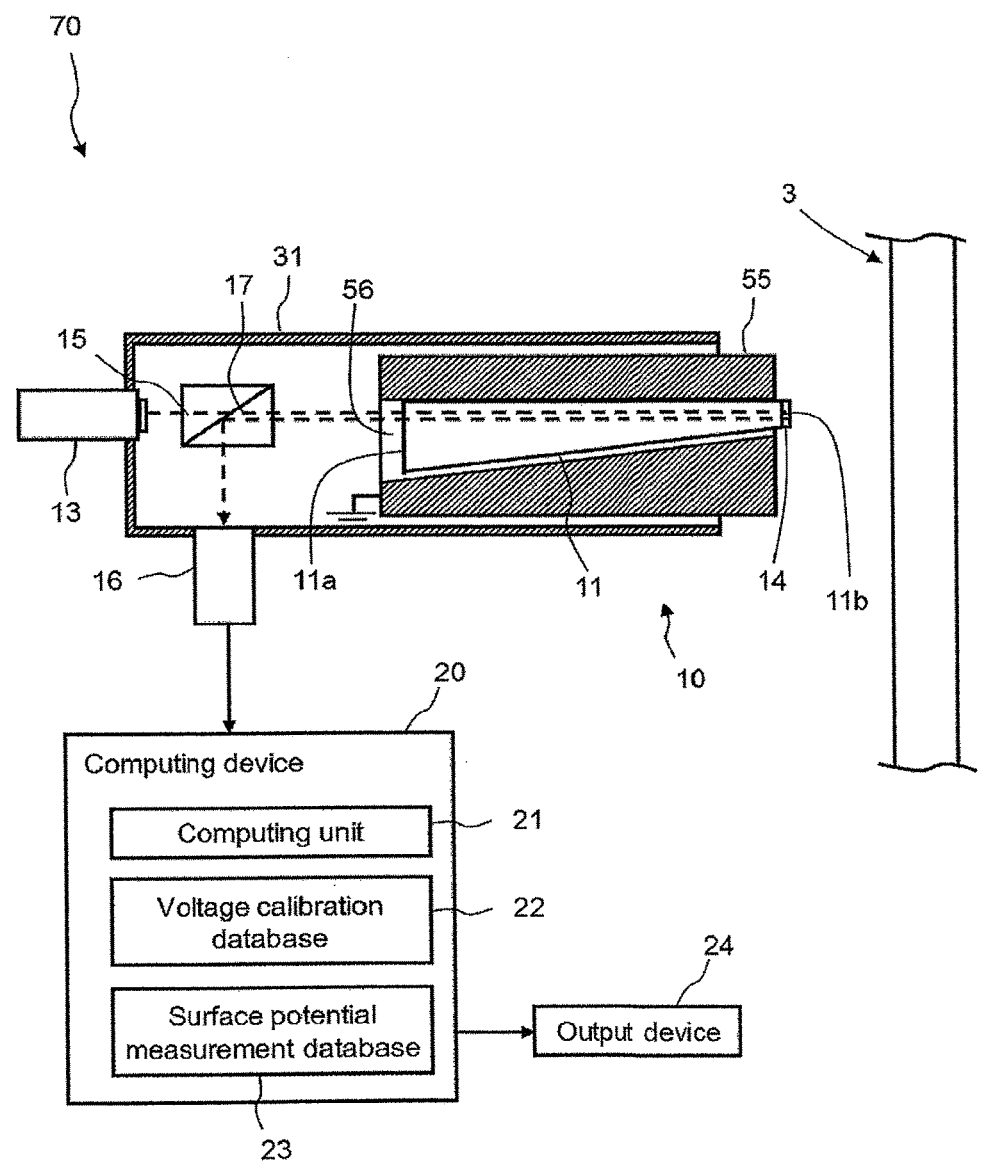
FIG. 7 is a longitudinal direction cross-sectional plan view of a main body including the Pockels crystal of a 3D surface potential distribution measurement apparatus according to a third embodiment.

FIG. 7 is a longitudinal cross-sectional plan view of a body including the Pockels crystal of a 3D surface potential distribution measurement apparatus according to a third embodiment. The third embodiment is a modification of the first embodiment.

A guide hole 56 is formed in a protecting part 55 so as to allow the Pockels crystal 11 to be moved therein. The guide hole 56 penetrates the protecting part 55 in the longitudinal direction of the Pockels crystal 11. The guide hole 56 is formed so as to be gradually reduced in area from a side corresponding to the first end face 11a of the Pockels crystal 11 toward a side corresponding to the second end face 11b. The guide hole 56 is set to a size causing the Pockels crystal 11 to stop at a position that does not protrude from the protecting part 55. Alternatively, a configuration may be adopted in which the Pockels crystal 11 protrudes from the protecting part 55. In this case, a protrusion length of the Pockels crystal 11 is limited.

Preferably, four inner side surfaces of the guide hole 56 have the same inclinations as those of four side surfaces of the Pockels crystal 11 so as to prevent a local load from being applied to the Pockels crystal 11 in a state where movement of the Pockels crystal 11 is limited.

The Pockels crystal 11 moves its side surface having no tapered portion along an inner side surface of the guide hole 56 that faces the side surface of the Pockels crystal 11.

According to the present embodiment as described above, the Pockels crystal 11 can be protected by making use of the tapered configuration of the Pockels crystal 11, thus eliminating the need to add a special component like the Pockels crystal holder 51 in the second embodiment. That is, even if a target position of the Pockels crystal 11 is set so as to cause interference between the Pockels crystal 11 and the electric field relaxation system 3, the Pockels crystal 11 stops in the middle of the guide hole 56 since the guide hole 56 becomes narrower as the Pockels crystal 11 approaches the electric field relaxation system 3. By such a movement limiting structure, the Pockels crystal 11 stops at a portion inside an end face of the protecting part 55 or does not protrude excessively from the protecting part 55. This prevents the Pockels crystal 11 from being damaged due to contact with the electric field relaxation system 3.

As described above, according to the present embodiment, it is possible to measure with accuracy the surface potential of the electric field relaxation system 3 in which the inverter pulse voltage is generated without damaging soundness of the tapered Pockels crystal 11.

Fourth Embodiment

Figure 8:
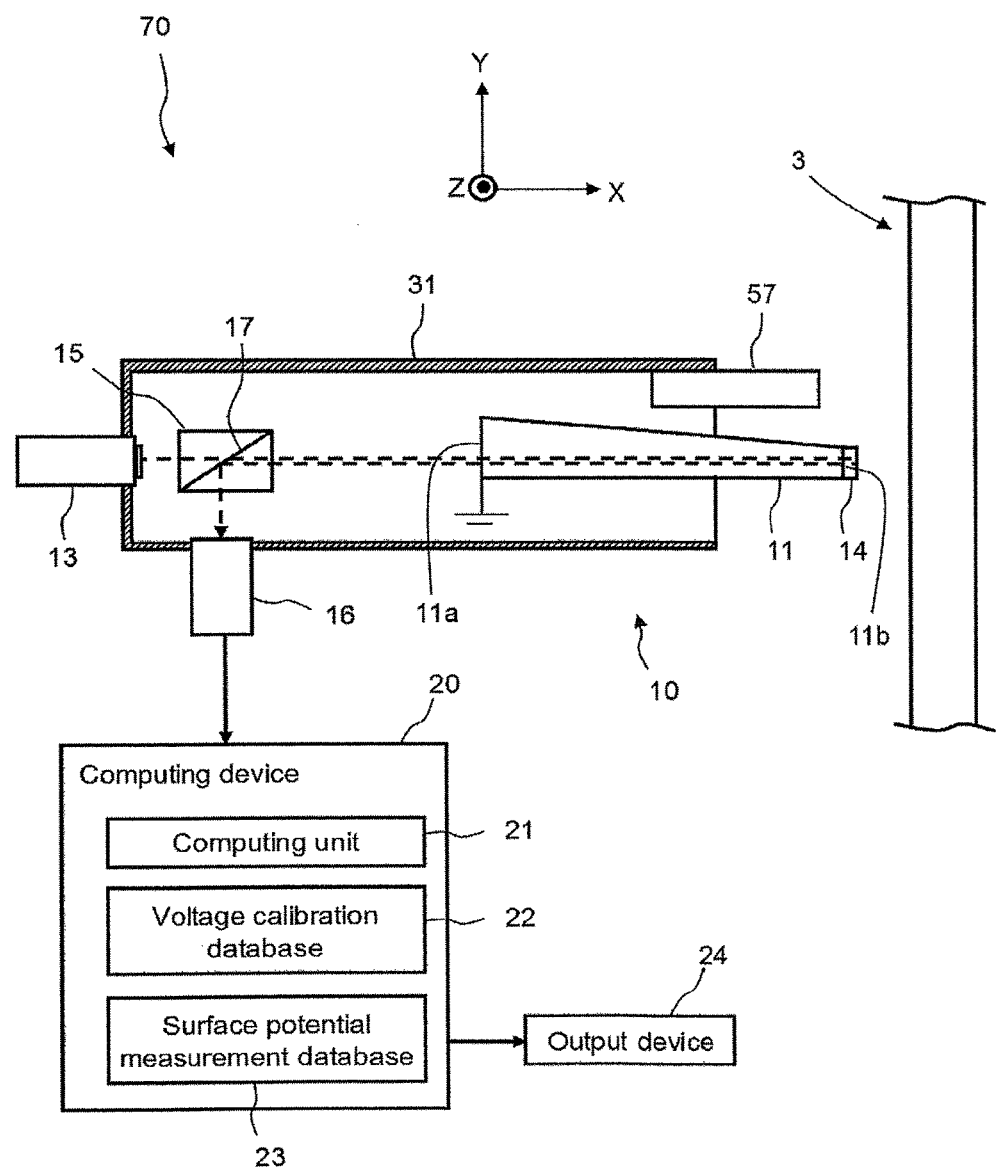
FIG. 8 is a longitudinal direction cross-sectional plan view of a main body including the Pockels crystal of a 3D surface potential distribution measurement apparatus according to a fourth embodiment. The fourth embodiment is a modification of the first embodiment.

FIG. 8 is a longitudinal cross-sectional plan view of a body including the Pockels crystal of a 3D surface potential distribution measurement apparatus according to a fourth embodiment. The fourth embodiment is a modification of the first embodiment.

In the present embodiment, a gap sensor 57 is provided in the support structure 31. The gap sensor 57 measures an interval between itself and the electric field relaxation system 3 to be measured and outputs the measured interval to the drive controller 37.

The drive controller 37 controls the X-direction driver 32a, Y-direction driver 33a, Z-direction driver 34a, and rotary driver 35 so that the gap output from the gap sensor 57 becomes a predetermined target value. The target value is set to a value corresponding to a desirable interval between the Pockels crystal 11 and the electric field relaxation system 3.

As described above, according to the present embodiment, it is possible to measure with accuracy the surface potential of the electric field relaxation system 3 in which the inverter pulse voltage is generated without damaging soundness of the tapered Pockels crystal 11.

Other Embodiments

While certain embodiments of the present invention have been described, these embodiments have been presented by way of example only, and are not intended to limit the scope of the invention. In the above embodiments, the X- and Y-directions are defined as the horizontal direction, and the Z-direction is defined as the vertical direction for descriptive convenience; however, the three-dimensional space defined by X-ax, Y-ax, and Z-ax may be rotated in an arbitrary direction.

These novel embodiments can be practiced in other various forms, and various omissions, substitutions and changes may be made without departing from the scope of the invention.

The embodiments and modifications thereof are included in the scope or spirit of the present invention and in the appended claims and their equivalents.

EXPLANATION OF REFERENCE SYMBOLS

1: stator coil conductor, 3: electric field relaxation system, 4: main insulating layer, 5: low resistance layer, 6: electric field relaxation layer, 7: stator core, 8: stator coil end simulation test body (test object), 10: measuring device body, 11: Pockels crystal, 11a: first end face, 11b: second end face, 13: laser light source, 14: mirror, 15: PBS (polarization beam splitter), 16: light detector, 17: wave length plate, 20: computing device, 21: computing unit, 22: voltage calibration database, 23: surface potential measurement database, 24: output device, 30: support/mount unit, 31: support structure, 32: X-direction moving section, 32a: X-direction driver, 33: Y-direction moving section, 33a: Y-direction driver, 34a: Z-direction driver, 35: rotary driver, 36: base, 37: drive controller, 51: Pockels crystal holder, 52: protecting part, 53: movement limiter, 55: protecting part, 56: guide hole, 57: gap sensor, 70: 3D surface potential distribution measurement apparatus

The invention claimed is:

1. A three-dimensional surface potential distribution measurement apparatus to measure a surface potential of an electric field relaxation system which is formed along a longitudinal direction of a test object simulating a stator coil end of a rotating electrical machine, the apparatus comprising:
    a laser light source configured to emit laser light;
    a Pockels crystal configured to receive, at its first end face, the laser light emitted from the laser light source;
    a mirror having a mirror surface positioned at a second end face of the Pockels crystal that is opposed to the first end face, the mirror being configured to reflect the laser light from the one end face of the Pockels crystal in a direction opposite to the incident direction of the laser light;
    a light detector having a band following a high-frequency component of an inverter pulse voltage, the light detector being configured to receive the laser light reflected by the mirror, and to detect a light intensity of the laser light corresponding to an output voltage which is a potential difference between the first end face of the Pockels crystal and the second end face thereof;
    a support structure configured to support the laser light source, the Pockels crystal, the mirror, and the light detector while maintaining a relative positional relationship thereamong;
    a movement driver capable of three-dimensionally moving the support structure;
    a rotary driver configured to support the test object, the rotary driver being capable of rotating the test object about an axis extending in a longitudinal direction of the test object in both clockwise and counterclockwise directions; and
    a drive controller configured to control the movement driver and the rotary driver, wherein
    the drive controller coordinates a driving operation by the movement driver and a driving operation by the rotary driver while maintaining a gap between the second end face of the Pockels crystal and a surface of the test object at a predetermined value such that the second end face of the Pockels crystal approaches the surfaces of the electric field relaxation system on the test object.

2. The three-dimensional surface potential distribution measurement apparatus according to claim 1, wherein the Pockels crystal is formed to become gradually thinner from the first end face toward the second end face.

3. The three-dimensional surface potential distribution measurement apparatus according to claim 1, wherein the support structure has: a Pockels crystal holder that holds the Pockels crystal and moves integrally with the Pockels crystal, and a movement limiter that limits movement of the Pockels crystal holder.

4. The three-dimensional surface potential distribution measurement apparatus according to claim 1, wherein the support structure has a guide hole penetrating the support structure in a moving direction of the Pockels crystal so as to allow the Pockels crystal to move therein, and the guide hole is formed to become gradually thinner toward the electric field relaxation system so as to limit protrusion of the second end face of the Pockels crystal from the support structure.

5. The three-dimensional surface potential distribution measurement apparatus according to claim 1, wherein
the support structure further has a gap sensor measuring a gap between the Pockels crystal and the electric field relaxation system and outputting a gap signal to the drive controller.

6. The three-dimensional surface potential distribution measurement apparatus according to claim 1, wherein
the Pockels crystal is a BGO crystal.

* * * * *